United States Patent
Okamoto et al.

(10) Patent No.: US 10,943,033 B2
(45) Date of Patent: Mar. 9, 2021

(54) INFORMATION RETRIEVAL APPARATUS, INFORMATION RETRIEVAL METHOD, AND COMPUTER PROGRAM PRODUCT

(71) Applicant: Kabushiki Kaisha Toshiba, Tokyo (JP)

(72) Inventors: Masayuki Okamoto, Kanagawa (JP); Hirokazu Suzuki, Tokyo (JP); Hiroko Fujii, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 363 days.

(21) Appl. No.: 15/894,970

(22) Filed: Feb. 13, 2018

(65) Prior Publication Data
US 2019/0087514 A1   Mar. 21, 2019

(30) Foreign Application Priority Data

Sep. 20, 2017   (JP) .............................. JP2017-180260

(51) Int. Cl.
*G06F 30/13*   (2020.01)
*G06F 16/93*   (2019.01)
*G06F 16/951*   (2019.01)

(52) U.S. Cl.
CPC .............. *G06F 30/13* (2020.01); *G06F 16/93* (2019.01); *G06F 16/951* (2019.01)

(58) Field of Classification Search
CPC .......... G06F 30/13; G06F 30/00; G06F 16/93; G06F 16/951; G06F 17/5004; G06F 17/50
USPC .......................................................... 703/1
See application file for complete search history.

(56) References Cited

U.S. PATENT DOCUMENTS

| 9,146,827 | B2 | 9/2015 | Shimizu | |
|---|---|---|---|---|
| 2013/0339810 | A1* | 12/2013 | Shimizu | G06F 11/324 714/57 |
| 2015/0199567 | A1* | 7/2015 | Fume | G06K 9/00483 382/187 |
| 2018/0260495 | A1 | 9/2018 | Fujii et al. | |

FOREIGN PATENT DOCUMENTS

| JP | 09212353 | A | * | 8/1997 | |
|---|---|---|---|---|---|
| JP | 2003176981 | A | * | 6/2003 | ............. F25J 3/0486 |
| JP | 2006-252237 | | | 9/2006 | |
| JP | 2010-015401 | | | 1/2010 | |
| JP | 2010015401 | A | * | 1/2010 | |

(Continued)

*Primary Examiner* — Cedric Johnson
(74) *Attorney, Agent, or Firm* — Finnegan, Henderson, Farabow, Garrett & Dunner, L.L.P.

(57) ABSTRACT

According to an embodiment, an information retrieval apparatus includes processing circuitry. The processing circuitry is configured to identify at least one first similar process similar to a process of interest corresponding to a certain design phase in design of a new plant, among processes of existing plants, based on a design document of the process of interest and design documents of individual processes of each of existing plants, identify at least one first subsequent process, a process after the first similar process, based on a design flow indicating a sequence of processes in an existing plant including the first similar process and retrieve a case corresponding to the first similar process and a case corresponding to the first subsequent process from a case database storing cases of troubles.

8 Claims, 13 Drawing Sheets

| PROCESS OF INTEREST: a | FIRST SIMILAR PROCESS | FIRST SUBSEQUENT PROCESS | SECOND SIMILAR PROCESS | SECOND SUBSEQUENT PROCESS |
|---|---|---|---|---|
| POWER PLANT A: a→b→c | a | b, c | - | - |
| POWER PLANT B: d→e→f→g | - | - | e | f, g |
| POWER PLANT C: a→e→c | a | e, c | - | - |

(56) References Cited

FOREIGN PATENT DOCUMENTS

| JP | 2013-080305 | 5/2013 |
| JP | 2018-147446 A | 9/2018 |
| WO | WO 2012/081080 A1 | 6/2012 |

\* cited by examiner

FIG.4

| PROCESS NUMBER | PROCESS NAME | PREVIOUS PROCESS | DEPARTMENT IN CHARGE | PERSON IN CHARGE |
|---|---|---|---|---|
| 1 | a | — | DEPARTMENT X | O |
| 2 | b | 1 | DEPARTMENT X | P |
| 3 | c | 2 | DEPARTMENT Y | Q |
| ... | ... | ... | ... | ... |

FIG.5

| PLANT NAME | PROCESS NAME | STUDY DATE | STUDY SUBJECT | STUDY RESULT |
|---|---|---|---|---|
| A | b | 2016/10/05 | ON TURBINE PIPING | USE Z BASED ON COMPANY REGULATIONS |
| A | c | 2016/10/05 | ON CONDENSER FORM | USE SURFACE CONDENSING TYPE AS CONDENSER FORM |
| B | f | 2016/11/12 | ... | ... |
| ⋮ | ⋮ | ⋮ | ⋮ | ⋮ |

FIG.6

| PLANT NAME | PROCESS NAME | PHENOMENON OCCURRING (TROUBLE) | CAUSE | COUNTER MEASURE | OCCURRENCE DATE | ADDRESSING COMPLETION DATE |
|---|---|---|---|---|---|---|
| A | c | STEAM LEAK FROM CV | xxxx | xxxx | 2001/02/10 | 2001/05/20 |
| B | f | EXHAUST TEMPERATURE INCREASE | LOSS OF CONDENSER VACUUM | yyyy | 2000/10/02 | 2000/12/12 |
| B | g | HEAT RESISTANT TEMPERATURE CONDITION UNACHIEVED | CONDITION ERROR IN SIMULATION | zzzz | 1998/07/08 | 1998/07/20 |
| ... | ... | ... | ... | ... | ... | ... |

FIG.7

| PROCESS OF INTEREST: a | FIRST SIMILAR PROCESS | FIRST SUBSEQUENT PROCESS | SECOND SIMILAR PROCESS | SECOND SUBSEQUENT PROCESS |
|---|---|---|---|---|
| POWER PLANT A: a→b→c | a | b, c | – | – |
| POWER PLANT B: d→e→f→g | – | – | e | f, g |
| POWER PLANT C: a→e→c | a | e, c | – | – |

FIG.8

| |
|---|
| RETRIEVAL CONDITION: A-a, C-a, A-b, A-c, C-e, C-c, B-e, B-f, B-g |
| POWER PLANT A: a→b→[c] |
| POWER PLANT B: d→[e]→[f]→g |
| POWER PLANT C: a→e→c |
| RETRIEVAL RESULT: A-[c], B-[e], B-[f] |

FIG.9

RETRIEVAL RESULT

NO. 1: POWER PLANT A-[c]

(REASON) TROUBLE OCCURRING IN SUBSEQUENT PROCESS OF SIMILAR PROCESS

NO. 2: POWER PLANT B-[e]

(REASON) TROUBLE OCCURRING IN PROCESS SIMILAR TO SUBSEQUENT PROCESS OF SIMILAR PROCESS

NO. 3: POWER PLANT B-[f]

(REASON) TROUBLE OCCURRING IN SUBSEQUENT PROCESS OF PROCESS SIMILAR TO SUBSEQUENT PROCESS OF SIMILAR PROCESS

FIG.12

| PROCESS OF INTEREST: h (a→h→c) | BEFORE-AND-AFTER SIMILAR PROCESS | THIRD SUBSEQUENT PROCESS | THIRD SIMILAR PROCESS | FOURTH SUBSEQUENT PROCESS |
|---|---|---|---|---|
| POWER PLANT A: a→b→c | b | c | - | - |
| POWER PLANT B: d→e→f→g | - | - | e | f, g |
| POWER PLANT D: a→e→c ↘i | e | c, i | - | - |

FIG.13

| |
|---|
| RETRIEVAL CONDITION: A-b, D-e, A-c, D-c, D-i, B-e, B-f, B-g |
| POWER PLANT A: a→b→[c] |
| POWER PLANT B: d→[e]→[f]→g |
| POWER PLANT D: a→e→c ↘[i] |
| RETRIEVAL RESULT: A-[c], D-[i], B-[e], B-[f] |

FIG.14

```
RETRIEVAL RESULT

NO. 1: POWER PLANT A-[c]

(REASON) TROUBLE OCCURRING IN SUBSEQUENT PROCESS
             OF BEFORE-AND-AFTER SIMILAR PROCESS

NO. 2: POWER PLANT D-[i]

(REASON) TROUBLE OCCURRING IN SUBSEQUENT PROCESS
             OF BEFORE-AND-AFTER SIMILAR PROCESS

NO. 3: POWER PLANT B-[e]

(REASON) TROUBLE OCCURRING IN PROCESS SIMILAR TO
             BEFORE-AND-AFTER SIMILAR PROCESS

NO. 4: POWER PLANT B-[f]

(REASON) TROUBLE OCCURRING IN SUBSEQUENT PROCESS
             OF PROCESS SIMILAR TO BEFORE-AND-AFTER
             SIMILAR PROCESS
```

INFORMATION RETRIEVAL APPARATUS, INFORMATION RETRIEVAL METHOD, AND COMPUTER PROGRAM PRODUCT

CROSS-REFERENCE TO RELATED APPLICATIONS

This application is based upon and claims the benefit of priority from Japanese Patent Application No. 2017-180260, filed on Sep. 20, 2017; the entire contents of which are incorporated herein by reference.

FIELD

Embodiments described herein relate generally to an information retrieval apparatus, an information retrieval method, and a computer program product.

BACKGROUND

When a power plant such as a thermal power plant, a hydraulic power plant, or a nuclear power plant is newly designed, it is desired that a designer grasps various troubles such as dimensional errors, material errors, and component breakage that have occurred in existing power plants and countermeasures against them, to avoid repeating the same troubles. In recent years, systems have been introduced which support the design of power plants by making a database of cases of the past that can be useful references in newly designing a power plant, such as records of study subjects and study results in the past design stage (study cases), and records of the causes of troubles that have occurred in the past and countermeasures (nonconformity cases) so that designers can refer to the database.

When retrieving cases from a database, a designer can usually select some of conditions to be satisfied in the design of a plurality of individual elements constituting a power plant to be designed, such as specifications of components constituting the power plant (such as component names), the type of the power plant such as thermal power, hydraulic power, or nuclear power, the maximum power, the number of revolutions of a generator, and the power generation method, to use them as retrieval keywords. In this case, there is a problem that a large number of cases containing the keywords are output as retrieval results, and particularly a young designer with less experience cannot determine which case among the retrieval results to focus on.

The design of a power plant is usually performed for each of a plurality of processes in plant construction. Therefore, cases that can be useful references in a certain design phase are considered to include cases of similar processes similar to a process corresponding to the design phase and subsequent processes affected by the similar processes among processes in existing power plants. However, previous retrieval methods cannot efficiently retrieve such cases, and need to be improved.

BRIEF DESCRIPTION OF THE DRAWINGS

FIG. 4 is a diagram illustrating an example of a design flow;

FIG. 5 is a diagram illustrating an example of study cases;

FIG. 6 is a diagram illustrating an example of nonconformity cases;

FIG. 7 is a diagram illustrating a specific example of processes included in a plurality of existing plants and a process of interest;

FIG. 8 is a diagram illustrating a specific example of retrieval processing by a retrieval unit;

FIG. 9 is a diagram illustrating a display example of retrieval results;

FIG. 12 is a diagram illustrating a specific example of processes included in a plurality of existing plants, a process of interest, and processes immediately before and immediately after the process of interest;

FIG. 13 is a diagram illustrating a specific example of retrieval processing by a retrieval unit;

FIG. 14 is a diagram illustrating a display example of retrieval results;

DETAILED DESCRIPTION

Figure 1:
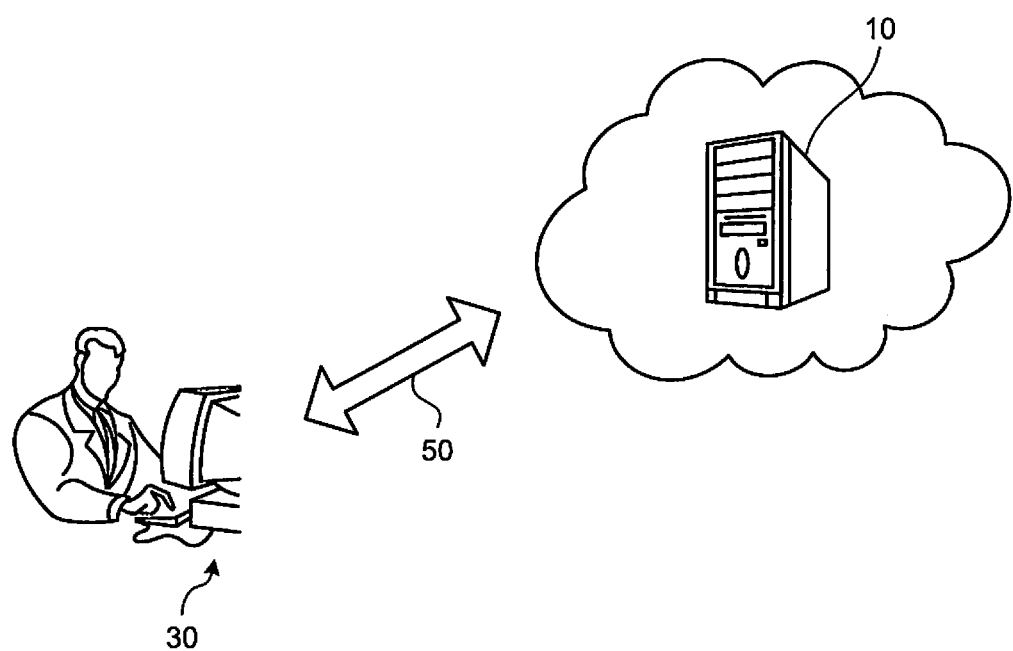
FIG. 1 is a diagram illustrating an overview of an information retrieval system.

According to an embodiment, an information retrieval apparatus for retrieving cases that can be useful references in designing a new plant from a case database storing cases of troubles that have occurred in existing plants each constructed through a plurality of processes, the apparatus includes processing circuitry. The processing circuitry is configured to identify at least one first similar process similar to a process of interest corresponding to a certain design phase in design of a new plant, among processes of a plurality of existing plants, based on a design document of the process of interest and design documents of individual processes of each of the plurality of existing plants, identify at least one first subsequent process, a process after the first similar process, based on a design flow indicating a sequence of a plurality of processes in an existing plant including the first similar process and retrieve a case corresponding to the first similar process and a case corresponding to the first subsequent process from the case database.

Hereinafter, an information retrieval apparatus, an information retrieval method, and a computer program product according to embodiments will be described in detail with reference to the accompanying drawings.

Outline of Embodiments

An information retrieval apparatus in the present embodiments is for retrieving cases that can be useful references in designing a new plant from a case database that stores cases of troubles that have occurred in existing plants. Here, a plant is a large-scale production facility called an industrial plant, such as a power plant such as a thermal power plant, a hydraulic power plant, or a nuclear power plant, a water treatment plant such as a water treatment facility or an industrial water recycling facility, or a chemical plant. An existing plant means a plant that has already been constructed, and a new plant means a plant to be newly designed.

Generally, the design of a plant is performed step by step in correspondence with a plurality of processes in plant construction. That is, a plant can be regarded as being constructed through a plurality of processes corresponding to design units in plant design. Here, cases that can be useful references in a certain design phase in plant design are considered to be, in particular, cases of processes similar to a process corresponding to the design phase (in the present embodiments, this is referred to as a "process of interest"), subsequent processes affected by the process, and the like, among cases stored in the case database.

The information retrieval apparatus in the present embodiments refers to an existing plant database so as to be able to efficiently detect such cases. In the existing plant database, for each existing plant, a design flow indicating the sequence of a plurality of processes in the existing plant, a design document of each process, and the like are stored. Here, a design document means various kinds of data on the design of the process, and is not limited to text data such as design specifications, and includes drawing data such as design drawings. Further, the number of design documents corresponding to one process is not limited to one, but may be plural.

The information retrieval apparatus in the present embodiments uses a design document of a process of interest as input, and refers to the existing plant database to identify a process similar to the process of interest, the subsequent process, and others among processes of a plurality of existing plants. Then, a case corresponding to each identified process is retrieved from the case database, and retrieval results are output. Here, in the present embodiments, the similarity relationship between processes is determined based on the degree of similarity between design documents in the processes, and the before-and-after relationship between processes is determined based on a design flow.

The information retrieval apparatus in the present embodiments can be implemented as a server computer in a server-client information retrieval system, for example. FIG. 1 is a diagram illustrating an overview of this information retrieval system. As illustrated in FIG. 1, the information retrieval system has a configuration in which a server computer (information retrieval apparatus 10) that provides an information retrieval service and a client terminal 30 such as a personal computer used by a user are connected via a network 50 such as the Internet. In this case, the user can access the server computer (information retrieval apparatus 10) by operating the client terminal 30 to use the information retrieval service provided by the server computer (information retrieval apparatus 10). Note that the information retrieval apparatus in the present embodiments may be configured such that its functions are implemented by a personal computer used by a user or the like.

Hereinafter, specific examples of the information retrieval apparatus in the present embodiments will be described in more detail, assuming a case where a power plant is newly designed. In the following description, the same reference numerals are given to components having similar functions, and duplicate explanations will be appropriately omitted.

First Embodiment

Figure 2:
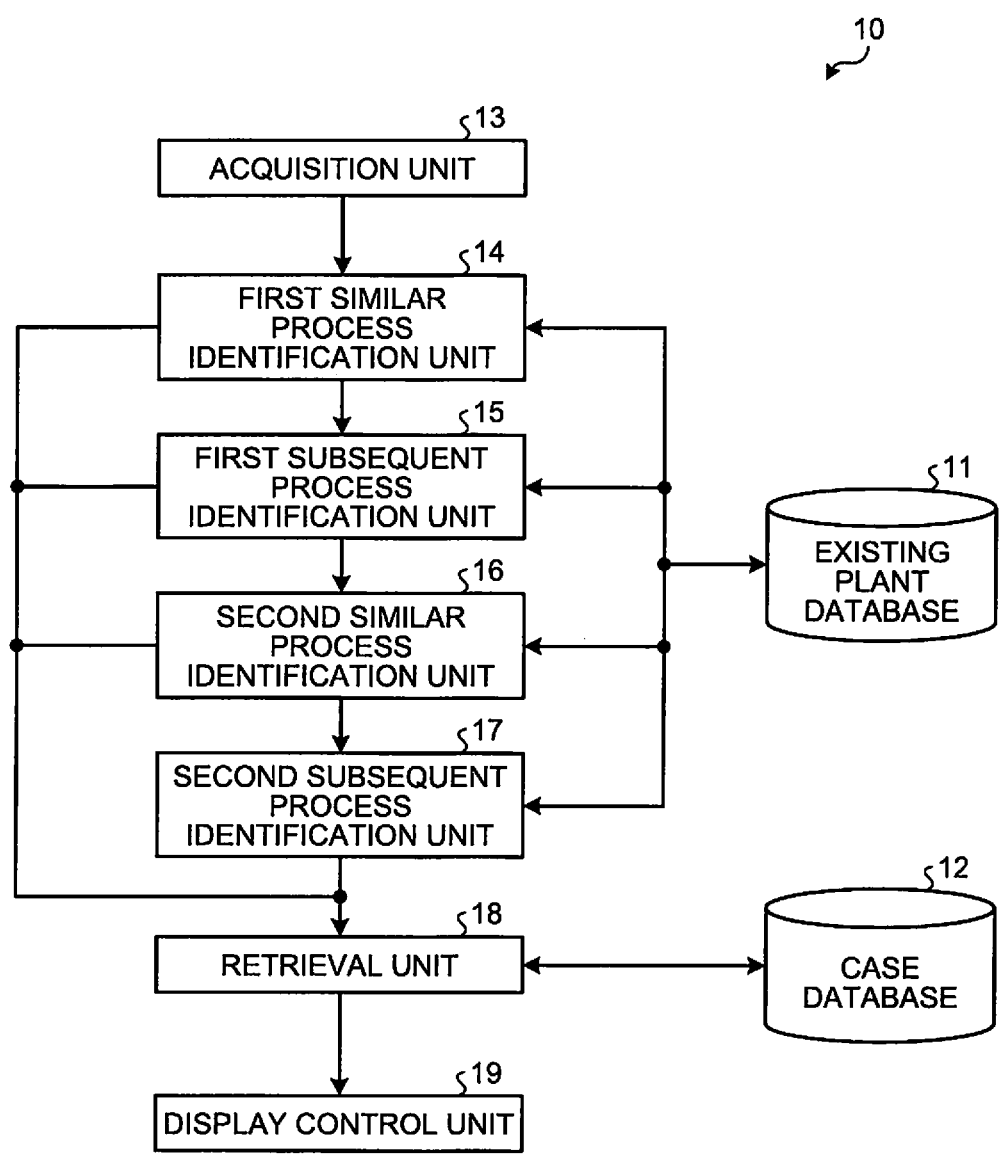
FIG. 2 is a block diagram illustrating a functional configuration example of an information retrieval apparatus according to a first embodiment.

FIG. 2 is a block diagram illustrating a functional configuration example of the information retrieval apparatus 10 according to a first embodiment. As illustrated in FIG. 2, the information retrieval apparatus 10 in the present embodiment includes an existing plant database 11, a case database 12, an acquisition unit 13, a first similar process identification unit 14, a first subsequent process identification unit 15, a second similar process identification unit 16, a second subsequent process identification unit 17, a retrieval unit 18, and a display control unit 19.

The existing plant database 11 is a database for storing various kinds of data on the design of existing plants. In the existing plant database 11, for each of a plurality of existing plants, a design flow, a design document of each process, and the like described above are stored using, for example, a hierarchical directory structure.

Figure 3:
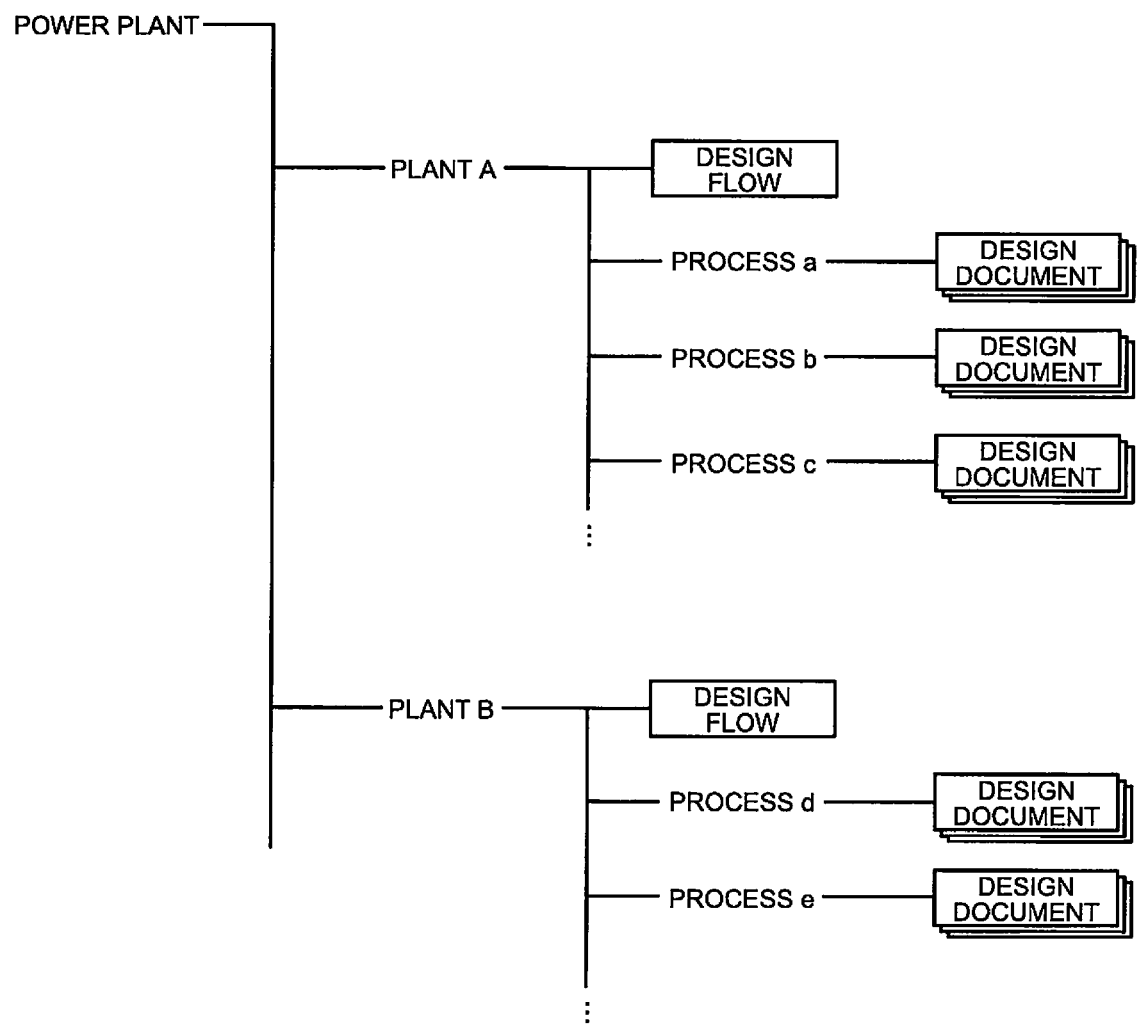
FIG. 3 is a diagram illustrating an example of a directory structure of an existing plant database.

FIG. 3 is a diagram illustrating an example of the directory structure of the existing plant database. As illustrated in FIG. 3, for example, the directory structure of the existing plant database 11 is a hierarchical structure in which "POWER PLANT" is a root, and under that, directories corresponding to the existing plants such as "PLANT A" and "PLANT B" identified by plant names are provided, and under them, directories corresponding to processes of the existing plants such as "PROCESS a" and "PROCESS b" identified by process names are provided. In a directory corresponding to an existing plant, a design flow corresponding to the existing plant is stored as a file, and in a directory corresponding to a process, a design document (design document group) corresponding to the process is stored as a file.

As described above, a design flow stored in a directory corresponding to an existing plant is data indicating the sequence of a plurality of processes in the existing plant. An example of a design flow is illustrated in FIG. 4. The design flow exemplified in FIG. 4 is a design flow corresponding to an existing plant of the plant name "A," and indicates that processes identified by the process names "a," "b," and "c" were performed in this order. A process number indicates a number assigned to each process for convenience, and a previous process indicates a process number of a process performed before that process. When there is a plurality of processes in which a common process number is stored in the previous process, those processes can be performed in parallel, indicating that there is no sequence dependency. In a department in charge, the name of a department in charge of the process is stored. In a person in charge, the name of a person in charge of the process is stored. A design flow only needs to be data indicating the sequence of a plurality of processes in an existing plant, and is not limited to data in a format exemplified in FIG. 4.

As described above, a design document stored in a directory corresponding to a process of an existing plant is various kinds of data on the design of the process, such as text data such as design specifications and drawing data such as design drawings. Design specifications describing the respective element values of a plurality of elements constituting an existing plant may be included in a design document in each process of the existing plant. For example, design specifications for a turbine of a thermal power plant describe element values for individual elements such as the thermal power, the fuel, the heat resistant temperature, the turbine type, the turbine configuration, the condenser vacuum, the piping, the control valve (CV) outer diameter, and the main stop valve (MSV). As described above, a design document group including a plurality of design documents may correspond to each process.

The case database 12 is a database that stores cases of troubles that have occurred in existing plants in association with plant names and process names. The cases stored in the case database 12 include, for example, study cases in which study subjects and study results in the past design stage of the existing plants are recorded, and nonconformity cases in which the causes of troubles that have occurred in the past in the existing plants and countermeasures are recorded.

FIG. 5 is a diagram illustrating an example of study cases. Each study case exemplified in FIG. 5 is data in which a study date, a study subject, and a study result are recorded in association with the plant name and a process name of an existing plant corresponding to the case.

FIG. 6 is a diagram illustrating an example of nonconformity cases. Each nonconformity case exemplified in FIG. 6 is data in which a phenomenon occurring (trouble), a cause, a countermeasure, an occurrence date, and an addressing completion date are recorded in association with the plant name and a process name of an existing plant corresponding to the case. A study case and a nonconformity case are registered in the case database 12 every time those cases occur, for example. Note that a process name in a nonconformity case may be inferred from the description of other items in the nonconformity case and added after the nonconformity case is registered in the case database 12. The inference of a process may be implemented by, for example, a method of previously storing keywords, events, or the like for each process, dividing text described in the phenomenon occurring (trouble), the cause, the countermeasure, and the like into words and semantically analyzing them, and checking them against the keywords, events, or the like stored.

In the present embodiment, the information retrieval apparatus 10 includes the existing plant database 11 and the case database 12. Alternatively, one or both of the existing plant database 11 and the case database 12 may be provided in an external device that the information retrieval apparatus 10 can access via the network 50 (see FIG. 1).

The acquisition unit 13 acquires a design document of a process of interest in response to an operation of a user using the information retrieval service provided by the information retrieval apparatus 10. For example, when the user transmits to the information retrieval apparatus 10 a design document such as design specifications and design drawings in the current design phase using the client terminal 30 (see FIG. 1) in order to retrieve cases to be useful references in the current design phase, the acquisition unit 13 acquires the design document as a design document of a process of interest. Alternatively, the acquisition unit 13 may access the storage location of a design document specified by the user to acquire the design document stored in the storage location as a design document of a process of interest. The design document of the process of interest acquired by the acquisition unit 13 is passed to the first similar process identification unit 14.

Based on the design document of the process of interest acquired by the acquisition unit 13 and the design documents of the individual processes of each of the plurality of existing plants stored in the existing plant database 11, the first similar process identification unit 14 identifies at least one process similar to the process of interest (in the present embodiment, this is referred to as a "first similar process") among the processes of the plurality of existing plants. For example, the first similar process identification unit 14 calculates the degree of similarity with the design document of the process of interest for each of the design documents stored in the existing plant database 11. When there is a design document exceeding a reference value in the degree of similarity with the design document of the process of interest, a process of an existing plant corresponding to the design document is identified as a first similar process.

For the calculation of the degree of similarity between design documents, for example, a method known as a method of calculating the degree of inter-document similarity, such as a tf-idf Cos similarity estimation method, can be used. When a process of interest has a plurality of design documents, for example, for each of the design documents stored in the existing plant database 11, the degree of similarity with each of the plurality of design documents of the process of interest is calculated. If there is a design document exceeding a reference value in the sum of the degrees of similarity with the design documents of the process of interest or a value obtained by performing a predetermined arithmetic operation on the sum, a process of an existing plant corresponding to the design document may be identified as a first similar process. Alternatively, if there is a process exceeding a reference value in the sum of the degrees of similarity of a plurality of design documents corresponding to the process stored in the existing plant database 11 or a value obtained by performing a predetermined arithmetic operation on the sum, the process may be identified as a first similar process.

The first similar process identification unit 14 may previously store keywords or the like representing the characteristics of processes, and determine the similarity between design documents using the number of times a common keyword appears or the like as a clue. When design documents are in a format having an entry column in which a process name is entered, the similarity between design documents may be determined with process names as a clue. For example, it is determined that design documents whose process names entered in their respective entry columns match or close to each other are similar to each other. Information indicating a first similar process identified by the first similar process identification unit 14 is passed to the first subsequent process identification unit 15 and the retrieval unit 18.

Based on a design flow stored in the existing plant database 11 in association with the existing plant including the first similar process identified by the first similar process identification unit 14, the first subsequent process identification unit 15 identifies at least one process performed after the first similar process (in the present embodiment, this is referred to as a "first subsequent process"). Not only a process immediately after the first similar process but also all processes downstream of the first similar process in the design flow correspond to first subsequent processes. Information indicating the first subsequent process identified by the first subsequent process identification unit 15 is passed to the second similar process identification unit 16 and the retrieval unit 18.

Here, the relationship between the process of interest and the first similar process and the first subsequent process described above will be described with reference to a specific example. FIG. 7 is a diagram illustrating a specific example of processes included in a plurality of existing plants and a process of interest. Lowercase alphabets in the figure each represent a process, and indicate that processes represented by the same letter are processes similar to each other. Arrows in the figure each represent the before-and-after relationship between processes. Here, assume that as a plurality of existing plants, there are three existing plants, a power plant A constructed through a process a, a process b, and a process c, a power plant B constructed through a process d, a process e, a process f, and a process g, and a power plant C constructed through a process a, a process e, and a process c.

When a process of interest is a process a as illustrated in the example of FIG. 7, the first similar process identification unit 14 identifies the process a of the power plant A and the process a of the power plant C as first similar processes. Then, the first subsequent process identification unit 15 identifies, as first subsequent processes, the process b and the process c of the power plant A performed after the process a of the power plant A, and the process e and the process c of the power plant C performed after the process a of the power plant C.

The second similar process identification unit 16 identifies, among the processes of the plurality of existing plants, at least one process similar to the first subsequent process (in the present embodiment, this is referred to as a "second similar process"), based on a design document of the first subsequent process identified by the first subsequent process identification unit 15 and the design documents of the individual processes of each of the plurality of existing plants stored in the existing plant database 11 (excluding the design document of the first subsequent process). For example, the second similar process identification unit 16 calculates the degree of similarity with the design document of the first subsequent process for each of the design documents (excluding the design document of the first subsequent process) stored in the existing plant database 11. If there is a design document whose degree of similarity with the design document of the first subsequent process exceeds a reference value, a process of an existing plant corresponding to the design document is identified as a second similar process. Note that the similarity between design documents can be determined using a method similar to that in the first similar process identification unit 14. Information indicating the second similar process identified by the second similar process identification unit 16 is passed to the second subsequent process identification unit 17 and the retrieval unit 18.

Based on a design flow stored in the existing plant database 11 in association with the existing plant including the second similar process identified by the second similar process identification unit 16, the second subsequent process identification unit 17 identifies at least one process performed after the second similar process (in the present embodiment, this is referred to as a "second subsequent process"). Not only a process immediately after the second similar process but also all processes downstream of the second similar process in the design flow correspond to second subsequent processes. Information indicating the second subsequent process identified by the second subsequent process identification unit 17 is passed to the retrieval unit 18.

Here, the relationship between the first subsequent process, the second similar process, and the second subsequent process described above will be described with reference to the specific example illustrated in FIG. 7. When the process b and the process c of the power plant A and the process e and the process c of the power plant C are identified as first subsequent processes as illustrated in the example of FIG. 7, the second similar process identification unit 16 identifies the process e of the power plant B as a second similar process since the process e similar to the process e of the power plant C, one of the first subsequent processes, is included in the power plant B. Then, the second subsequent process identification unit 17 identifies the process f and the process g of the power plant B performed after the process e of the power plant B as second subsequent processes.

The retrieval unit 18 retrieves, from the case database 12, a case corresponding to the first similar process, a case corresponding to the first subsequent process, a case corresponding to the second similar process, and a case corresponding to the second subsequent process, and outputs retrieval results. Specifically, the retrieval unit 18 executes an instruction to retrieve cases corresponding to retrieval conditions from the case database 12, with the first similar process, the first subsequent process, the second similar process, and the second subsequent process as the retrieval conditions, and thereby, if there is a case corresponding to any of the retrieval conditions, outputs information on the case as a retrieval result. Results of retrieval by the retrieval unit 18 are passed to the display control unit 19.

Here, a specific example of retrieval processing performed by the retrieval unit 18 will be described in association with the specific example illustrated in FIG. 7. FIG. 8 is a diagram illustrating a specific example of the retrieval processing performed by the retrieval unit 18. Uppercase alphabets in the figure each represent an existing power plant, lowercase alphabets each represent a process, and X-x represents a process x of a power plant X. [x] indicates that a case corresponding to a process x is stored in the case database 12.

As illustrated in the example of FIG. 7, assume that the first similar process identification unit 14 identifies A-a and C-a as first similar processes, the first subsequent process identification unit 15 identifies A-b, A-c, C-e, and C-c as first subsequent processes, the second similar process identification unit 16 identifies B-e as a second similar process, and the second subsequent process identification unit 17 identifies B-f and B-g as second subsequent processes. In this case, the retrieval unit 18 combines these processes by OR as retrieval conditions, and executes an instruction to retrieve cases corresponding to the retrieval conditions from the case database 12. Here, as illustrated in FIG. 8, a case corresponding to A-c, a case corresponding to B-e, and a case corresponding to B-f are stored in the case database 12, but no cases corresponding to the other processes are stored. Thus, the retrieval unit 18 retrieves the case corresponding to the first subsequent process A-c, the case corresponding to the second similar process B-e, and the case corresponding to the second subsequent process B-f from the case database 12, and outputs information on those cases as retrieval results.

The display control unit 19 causes a display device or the like of the client terminal 30 to display the results of retrieval by the retrieval unit 18 together with information indicating the relationship between each case contained in the retrieval results and the process of interest. At this time, the display control unit 19 desirably prioritize the cases contained in the retrieval results in order determined based on their relationships with the process of interest and causes the display device to display them in the order. For example, the display control unit 19 prioritizes the cases contained in retrieval results in the order of a case corresponding to a first similar process, a case corresponding to a first subsequent process, a case corresponding to a second similar process, and a case corresponding to a second subsequent process, and causes the display device to display the cases contained in the retrieval results in descending order of priorities.

FIG. 9 is a diagram illustrating a display example of retrieval results displayed on the display device by the display control unit 19, and illustrates a display example of the retrieval results illustrated in the specific example of FIG. 8. In the example of FIG. 9, information indicating the relationship between each case contained in the retrieval results and the process of interest is displayed as the reason why the case has been retrieved. Among the cases contained in the retrieval results, the case corresponding to the first subsequent process A-c having the closest relationship with the process of interest is ranked first, the case corresponding to the second similar process B-e having the second closest relationship with the process of interest is ranked second, and the case corresponding to the second subsequent process B-f having the farthest relationship with the process of interest is ranked third, and these cases are displayed in the order. The user can refer to a desired case among the cases contained in the retrieval results displayed on the display device by specifying the case by a click operation with a mouse or the like, for example.

Note that the display example of the retrieval results illustrated in FIG. 9 is an example, and the present invention is not limited to this. For example, when cases contained in retrieval results are nonconformity cases, the display control unit 19 may check whether the nonconformity cases have been addressed, and prioritize the cases so that an unaddressed nonconformity case is ranked higher. Alternatively, the severity of nonconformity cases may be recorded to prioritize the cases so that the higher the severity, the higher the rank.

Figure 10:
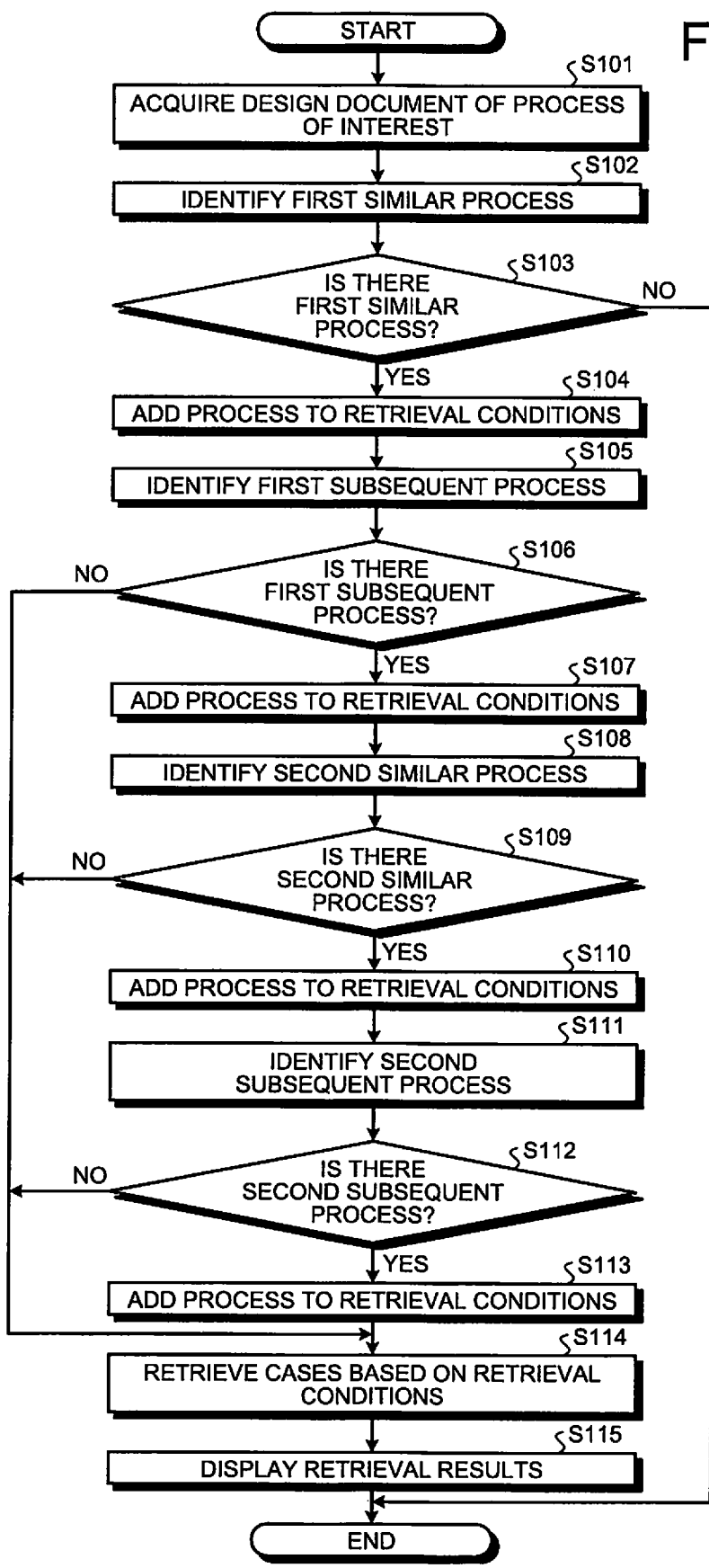
FIG. 10 is a flowchart illustrating an operation example of the information retrieval apparatus according to the first embodiment.

Here, an operation of the information retrieval apparatus 10 in the present embodiment will be described along the flowchart in FIG. 10. FIG. 10 is a flowchart illustrating an operation example of the information retrieval apparatus 10 in the present embodiment. Since specific processing details of each step in the flowchart in FIG. 10 are as described above, duplicate explanations will be omitted as appropriate.

When a process illustrated in the flowchart of FIG. 10 is started, first, the acquisition unit 13 acquires a design document of a process of interest and passes it to the first similar process identification unit 14 (step S101). Next, based on the design document of the process of interest received from the acquisition unit 13 and design documents stored in the existing plant database 11, the first similar process identification unit 14 performs processing to identify a first similar process from among processes of a plurality of existing plants (step S102). Here, when no first similar processes are identified (step S103: No), the process is ended without processing. On the other hand, when a first similar process is identified (step S103: Yes), information on the first similar process is passed to the first subsequent process identification unit 15 and the retrieval unit 18. The retrieval unit 18 adds the first similar process identified by the first similar process identification unit 14 to retrieval conditions (step S104).

Next, the first subsequent process identification unit 15 performs processing to identify a first subsequent process, based on a design flow of an existing plant including the first similar process identified by the first similar process identification unit 14 (step S105). Here, when no first subsequent processes are identified (step S106: No), the process proceeds to step S114 to be described later. On the other hand, when a first subsequent process is identified (step S106: Yes), information on the first subsequent process is passed to the second similar process identification unit 16 and the retrieval unit 18. The retrieval unit 18 adds the first subsequent process identified by the first subsequent process identification unit 15 to the retrieval conditions (step S107).

Next, the second similar process identification unit 16 performs processing to identify a second similar process from among the processes of the plurality of existing plants, based on a design document of the first subsequent process identified by the first subsequent process identification unit 15 and the other design documents among the design documents stored in the existing plant database 11 (step S108). Here, when no second similar processes are identified (step S109: No), the process proceeds to step S114 to be described later. On the other hand, when a second similar process is identified (step S109: Yes), information on the second similar process is passed to the second subsequent process identification unit 17 and the retrieval unit 18. The retrieval unit 18 adds the second similar process identified by the second similar process identification unit 16 to the retrieval conditions (step S110).

Next, the second subsequent process identification unit 17 performs processing to identify a second subsequent process, based on a design flow of an existing plant including the second similar process identified by the second similar process identification unit 16 (step S111). Here, when no second subsequent processes are identified (step S112: No), the process proceeds to step S114 to be described later. On the other hand, when a second subsequent process is identified (step S112: Yes), information on the second subsequent process is passed to the retrieval unit 18. The retrieval unit 18 adds the second subsequent process identified by the second subsequent process identification unit 17 to the retrieval conditions (step S113).

Next, the retrieval unit 18 searches the case database 12 based on the retrieval conditions, retrieves cases corresponding to the retrieval conditions from the case database 12, and outputs retrieval results (step S114). The retrieval results are passed to the display control unit 19. Next, the display control unit 19 causes the display device or the like of the client terminal 30 to display the results of the retrieval by the retrieval unit 18 (step S115).

As described above in detail with reference to the specific examples, in the present embodiment, a first similar process similar to a process of interest corresponding to a certain design phase in plant design is identified, based on the similarity between a design document of the process of interest and design documents of individual processes of a plurality of existing plants, and a first subsequent process, a process after the first similar process, is identified based on a design flow of an existing plant including the first similar process. Then, from the case database 12, a case corresponding to the first similar process and a case corresponding to the first subsequent process are retrieved. In this way, in the present embodiment, a case corresponding to a first similar process and a case corresponding to a first subsequent process can be retrieved in consideration of the flow of processes in addition to the similarity between design documents. Thus cases that can be useful references in a certain design phase in plant design can be efficiently retrieved.

Further, in the present embodiment, a second similar process similar to a first subsequent process is identified based on the similarity between design documents, and a second subsequent process, a process after the second similar process, is identified based on a design flow of an existing plant including the second similar process. Then, from the case database 12, a case corresponding to the second similar process and a case corresponding to the second subsequent process are further retrieved. This makes it possible to more properly retrieve cases that can be useful references, such as a case of trouble that has occurred in a process that can be affected by a first similar process.

In the description based on the specific example illustrated in FIG. 8, first similar processes similar to the process of interest a are A-a and C-a. No cases corresponding to these processes are stored in the case database 12. Thus, if cases are searched for based only on the similarity with the process of interest a, no valid retrieval results can be obtained. However, a case corresponding to A-c performed after A-a is stored in the case database 12. Thus, by retrieving a case corresponding to a first subsequent process in consideration of a process flow, A-[c] is obtained as a retrieval result. A first subsequent process is a process affected by a first similar process, and thus is considered to have high usefulness as a case.

Further, a second similar process similar to a first subsequent process and a second subsequent process that is a process after the second similar process are processes that can be affected by a first similar process, and thus are each considered to have high usefulness as a case. In the present embodiment, a case corresponding to the second similar process and a case corresponding to the second subsequent process are also retrieved from the case database 12, in consideration of the similarity between design documents and a process flow. Thus, highly useful cases such as B-[e] and B-[f] exemplified in FIG. 8 can be obtained as retrieval results.

Second Embodiment

Next, a second embodiment will be described. In the above-described first embodiment, when no first similar processes similar to a process of interest are identified, no cases can be retrieved from the case database 12. However, since the similarity between processes is determined based on the similarity between design documents of the processes, there is a possibility that a process actually similar to a process of interest is not identified as a first similar process because no design documents having sufficient similarity with a design document of the process of interest are stored in the existing plant database 11. On the other hand, since each process of an existing plant has dependency relationships with the previous and subsequent processes, if processes before and after a certain process are similar to processes before and after a process of interest, respectively, there is a high possibility that the certain process is actually a process similar to the process of interest even when not identified as a first similar process.

Therefore, in the second embodiment, when design documents of an immediately preceding process and an immediately following process of a process of interest are obtained, a process whose immediately preceding process and immediately following process are both similar to the immediately preceding process and the immediately following process of the process of interest (in the present embodiment, this is referred to as a "before-and-after similar process) is handled like a first similar process, and a case corresponding to the before-and-after similar process and a case corresponding to a process that can be affected by the before-and-after similar process are retrieved from the case database 12. This makes it possible that even when no first similar processes are identified, cases that can be useful references in a certain design phase in plant design can be properly retrieved.

Figure 11:
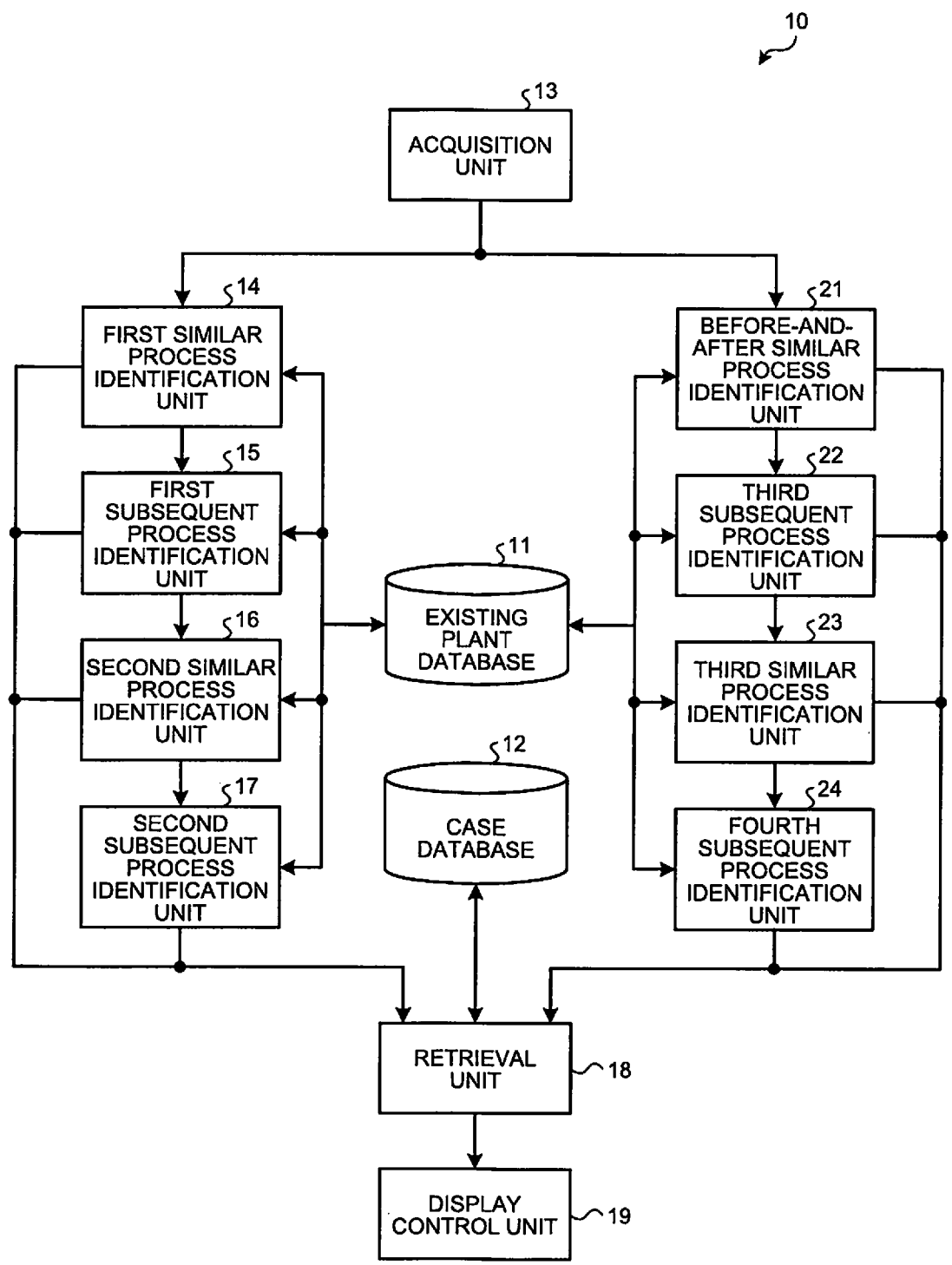
FIG. 11 is a block diagram illustrating a functional configuration example of an information retrieval apparatus according to a second embodiment.

FIG. 11 is a block diagram illustrating a functional configuration example of the information retrieval apparatus 10 according to the second embodiment. As illustrated in FIG. 11, the information retrieval apparatus 10 in the present embodiment includes, in addition to the configuration of the above-described first embodiment (see FIG. 2), a before-and-after similar process identification unit 21, a third subsequent process identification unit 22, a third similar process identification unit 23, and a fourth subsequent process identification unit 24.

The before-and-after similar process identification unit 21 identifies at least one before-and-after similar process among processes of a plurality of existing plants, based on a design document of an immediately preceding process of a process of interest, a design document of an immediately following process of the process of interest, a design flow and design documents of individual processes of each of the plurality of existing plants stored in the existing plant database 11. The before-and-after similar process is, as described above, a process whose immediately preceding process and immediately following process are similar to the immediately preceding process and the immediately following process of the process of interest, respectively.

Information indicating the before-and-after similar process identified by the before-and-after similar process identification unit 21 is passed to the third subsequent process identification unit 22 and the retrieval unit 18.

Based on a design flow stored in the existing plant database 11 in association with an existing plant including the before-and-after similar process identified by the before-and-after similar process identification unit 21, the third subsequent process identification unit 22 identifies at least one process performed after the before-and-after similar process (in the present embodiment, this is referred to as a "third subsequent process"). Not only a process immediately after the before-and-after similar process but also all processes downstream of the before-and-after similar process in the design flow correspond to third subsequent processes. Information indicating the third subsequent process identified by the third subsequent process identification unit 22 is passed to the third similar process identification unit 23 and the retrieval unit 18.

Here, the relationship between the process of interest, the before-and-after similar process, and the third subsequent process described above will be described using a specific example. FIG. 12 is a diagram illustrating a specific example of processes included in a plurality of existing plants, a process of interest, and processes immediately before and immediately after the process of interest. Lowercase alphabets in the figure each represent a process, and indicate that processes represented by the same letter are processes similar to each other. Arrows in the figure each represent the before-and-after relationship between processes. Here, assume that as the plurality of existing plants, there are three existing plants, a power plant A constructed through a process a, a process b, and a process c, a power plant B constructed through a process d, a process e, a process f, and a process g, and a power plant D constructed through a process a, a process e, a process c, and a process i. The process c and the process i of the power plant D are processes performed in parallel after the process e.

As illustrated in the example of FIG. 12, when the process of interest is a process h, the immediately preceding process is a process a, and the immediately following process is a process c, the before-and-after similar process identification unit 21 identifies, as before-and-after similar processes, the process b of the power plant A and the process e of the power plant D whose immediately preceding and immediately following processes are similar to those of the process of interest. Then, the third subsequent process identification unit 22 identifies, as third subsequent processes, the process c of the power plant A performed after the process b of the power plant A, and the process c and the process i of the power plant D performed after the process e of the power plant D.

The third similar process identification unit 23 identifies, among the processes of the plurality of existing plants, at least one process similar to the before-and-after similar process (in the present embodiment, this is referred to as a "third similar process"), based on a design document of the before-and-after similar process identified by the before-and-after similar process identification unit 21, and design documents of individual processes of each of the plurality of existing plants stored in the existing plant database 11 (excluding the design document of the before-and-after similar process). Information indicating the third similar process identified by the third similar process identification unit 23 is passed to the fourth subsequent process identification unit 24 and the retrieval unit 18.

Based on a design flow stored in the existing plant database 11 in association with an existing plant including the third similar process identified by the third similar process identification unit 23, the fourth subsequent process identification unit 24 identifies at least one process performed after the third similar process (in the present embodiment, this is referred to as a "fourth subsequent process"). Not only a process immediately after the third similar process but also all processes downstream of the third similar process in the design flow correspond to fourth subsequent processes. Information indicating the fourth subsequent process identified by the fourth subsequent process identification unit 24 is passed to the retrieval unit 18.

Here, the relationship between the third subsequent process, the third similar process, and the fourth subsequent process described above will be described, using the specific example illustrated in FIG. 12. As illustrated in the example in FIG. 12, when the process c of the power plant A and the process c and the process i of the power plant D are identified as before-and-after similar processes, the process e similar to the process e of the power plant D, one of the before-and-after similar processes, is included in the power plant B, and thus the third similar process identification unit 23 identifies the process e of the power plant B as a third similar process. Then, the fourth subsequent process identification unit 24 identifies the process f and the process g of the power plant B performed after the process e of the power plant B as fourth subsequent processes.

The retrieval unit 18 retrieves, from the case database 12, a case corresponding to the before-and-after similar process, a case corresponding to the third subsequent process, a case corresponding to the third similar process, and a case corresponding to the fourth subsequent process, and outputs retrieval results. Specifically, the retrieval unit 18 executes an instruction to retrieve cases corresponding to retrieval conditions from the case database 12, with the before-and-after similar process, the third subsequent process, the third similar process, and the fourth subsequent process as the retrieval conditions, and thereby, if there is a case corresponding to any of the retrieval conditions, outputs information on the case as a retrieval result. Results of retrieval by the retrieval unit 18 are passed to the display control unit 19.

Here, a specific example of retrieval processing by the retrieval unit 18 will be described in correspondence with the specific example illustrated in FIG. 12. FIG. 13 is a diagram illustrating a specific example of the retrieval processing by the retrieval unit 18. Uppercase alphabets in the figure each represent an existing power plant, lowercase alphabets each represent a process, and X-x represents a process x of a power plant X. [x] indicates that a case corresponding to a process x is stored in the case database 12.

As illustrated in the example of FIG. 12, assume that the before-and-after similar process identification unit 21 identifies A-b and D-e as before-and-after similar processes, the third subsequent process identification unit 22 identifies A-c, D-c, and D-i as third subsequent processes, the third similar process identification unit 23 identifies B-e as a third similar process, and the fourth subsequent process identification unit 24 identifies B-f and B-g as fourth subsequent processes. In this case, the retrieval unit 18 combines these processes by OR as retrieval conditions, and executes an instruction to retrieve cases corresponding to the retrieval conditions from the case database 12. Here, as illustrated in FIG. 13, a case corresponding to A-c, a case corresponding to B-e, a case corresponding to B-f, and a case corresponding to D-i are stored in the case database 12, but no cases corresponding to the other processes are stored. Thus, the retrieval unit 18 retrieves the cases corresponding to A-c and D-i that are the third subsequent processes, the case corresponding to B-e that is the third similar process, and the case corresponding to B-f that is the fourth subsequent process from the case database 12, and outputs information on those cases as retrieval results.

The results of retrieval by the retrieval unit 18 are passed to the display control unit 19, and displayed on the display device or the like of the client terminal 30 as in the above-described first embodiment. FIG. 14 is a diagram illustrating a display example of retrieval results displayed on the display device by the display control unit 19, and illustrates a display example of the retrieval results illustrated in the specific example of FIG. 13. In the example of FIG. 14, information indicating the relationship between each case contained in the retrieval results and the process of interest is displayed as the reason why the case has been retrieved. Among the cases contained in the retrieval results, the case corresponding to the third subsequent process A-c having the closest relationship with the process of interest is ranked first, the case corresponding to the third subsequent process D-i having the second closest relationship with the process of interest is ranked second, the case corresponding to the third similar process B-e having the third closest relationship with the process of interest is ranked third, and the case corresponding to the fourth subsequent process B-f having the farthest relationship with the process of interest is ranked fourth, and these cases are displayed in the order. The user can refer to a desired case among the cases contained in the retrieval results displayed on the display device by specifying the case by a click operation with a mouse or the like, for example.

Figure 15:
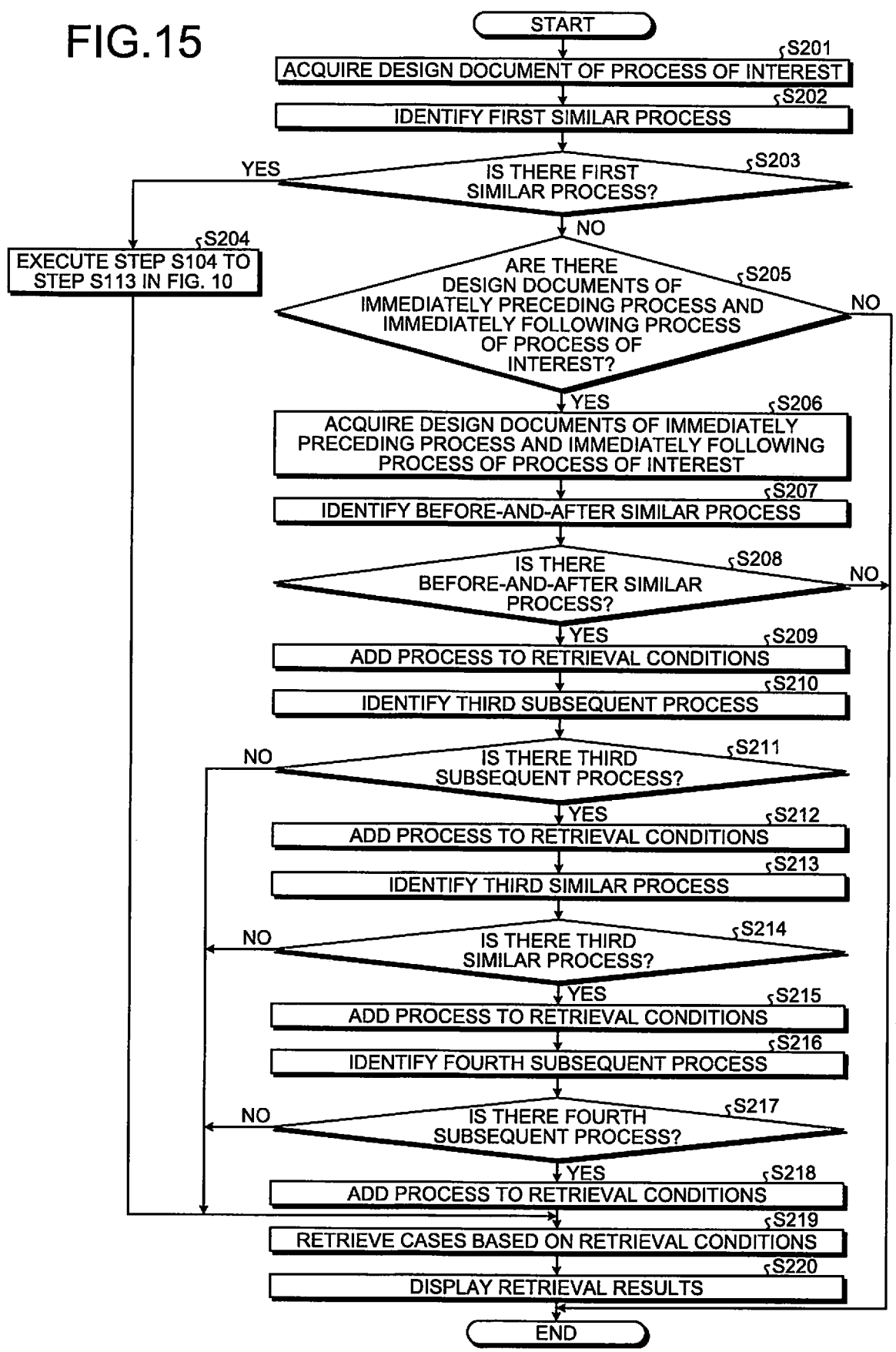
FIG. 15 is a flowchart illustrating an operation example of the information retrieval apparatus according to the second embodiment.

Here, an operation of the information retrieval apparatus 10 in the present embodiment will be described along the flowchart in FIG. 15. FIG. 15 is a flowchart illustrating an operation example of the information retrieval apparatus 10 in the present embodiment. Since specific processing details of each step in the flowchart of FIG. 15 are as described above, duplicate explanations will be omitted as appropriate.

When a process illustrated in the flowchart of FIG. 15 is started, first, the acquisition unit 13 acquires a design document of a process of interest and passes it to the first similar process identification unit 14 (step S201). Next, based on the design document of the process of interest received from the acquisition unit 13 and design documents stored in the existing plant database 11, the first similar process identification unit 14 performs processing to identify a first similar process from among processes of the plurality of existing plants (step S202). Here, when a first similar process is identified (step S203: Yes), the processing of step S104 to step S113 in FIG. 10 described in the above-described first embodiment is executed (step S204), and the process proceeds to step S219 to be described later.

On the other hand, when no first similar processes are identified (step S203: No), the acquisition unit 13 checks whether there are design documents of the immediately preceding process and the immediately following process of the process of interest (step S205). Here, if there are no design documents of the immediately preceding process and the immediately following process of the process of interest (step S205: No), the process is ended without processing. On the other hand, when there are design documents of the immediately preceding process and the immediately following process of the process of interest (step S205: Yes), the acquisition unit 13 acquires those design documents and passes them to the before-and-after similar process identification unit 21 (step S206).

Next, based on the design documents of the immediately preceding process and the immediately following process of the process of interest received from the acquisition unit 13 and the design documents stored in the existing plant database 11, the before-and-after similar process identification unit 21 performs processing to identify a before-and-after similar process from among the processes of the plurality of existing plants (step S207). Here, when no before-and-after similar processes are identified (step S208: No), the process is ended without processing. On the other hand, when a before-and-after similar process is identified (step S208: Yes), information on the before-and-after similar process is passed to the third subsequent process identification unit 22 and the retrieval unit 18. The retrieval unit 18 adds the before-and-after similar process identified by the before-and-after similar process identification unit 21 to retrieval conditions (step S209).

Next, the third subsequent process identification unit 22 performs processing to identify a third subsequent process, based on a design flow of an existing plant including the before-and-after similar process identified by the before-and-after similar process identification unit 21 (step S210). Here, when no third subsequent processes are identified (step S211: No), the process proceeds to step S219 to be described later. On the other hand, when a third subsequent process is identified (step S211: Yes), information on the third subsequent process is passed to the third similar process identification unit 23 and the retrieval unit 18. The retrieval unit 18 adds the third subsequent process identified by the third subsequent process identification unit 22 to the retrieval conditions (step S212).

Next, the third similar process identification unit 23 performs processing to identify a third similar process from among the processes of the plurality of existing plants, based on a design document of the third subsequent process identified by the third subsequent process identification unit 22 and the other design documents among the design documents stored in the existing plant database 11 (step S213). Here, when no third similar processes are identified (step S214: No), the process proceeds to step S219 to be described later. On the other hand, when a third similar process is identified (step S214: Yes), information on the third similar process is passed to the fourth subsequent process identification unit 24 and the retrieval unit 18. The retrieval unit 18 adds the third similar process identified by the third similar process identification unit 23 to the retrieval conditions (step S215).

Next, the fourth subsequent process identification unit 24 performs processing to identify a fourth subsequent process, based on a design flow of an existing plant including the third similar process identified by the third similar process identification unit 23 (step S216). Here, when no fourth subsequent processes are identified (step S217: No), the process proceeds to step S219 to be described later. On the other hand, when a fourth subsequent process is identified (step S217: Yes), information on the fourth subsequent process is passed to the retrieval unit 18. The retrieval unit 18 adds the fourth subsequent process identified by the fourth subsequent process identification unit 24 to the retrieval conditions (step S218).

Next, the retrieval unit 18 searches the case database 12 based on the retrieval conditions, retrieves cases corresponding to the retrieval conditions from the case database 12, and outputs retrieval results (step S219). The retrieval results are passed to the display control unit 19. Next, the display control unit 19 causes the display device or the like of the client terminal 30 to display the results of the retrieval by the retrieval unit 18 (step S220).

As described in detail above with reference to the specific examples, also in the present embodiment, in consideration of process flows in addition to the similarity between design documents as in the above-described first embodiment, a case corresponding to a before-and-after similar process whose immediately preceding and immediately following processes are similar to those of a process of interest, a case corresponding to a third subsequent process that is a subsequent process of the before-and-after similar process, a case corresponding to a third similar process similar to the third subsequent process, a case corresponding to a fourth subsequent process that is a subsequent process of the third similar process, and the like are retrieved. Therefore, as in the above-described first embodiment, it is possible to efficiently retrieve cases that can be useful references in a certain design phase in plant design.

In particular, in the present embodiment, based on findings that processes whose immediately preceding and immediately following processes are similar to each other are highly likely to be actually similar processes even when the similarity between their design documents is low, a case corresponding to a before-and-after similar process, a case corresponding to a third subsequent process, a case corresponding to a third similar process, and a case corresponding to a fourth subsequent process are individually retrieved. Therefore, even when no first similar processes similar to a process of interest are identified, it is possible to properly retrieve cases that can be useful references in a certain design phase in plant design.

Supplemental Explanation

The information retrieval apparatus 10 in the first embodiment and the second embodiment described above can be implemented by the cooperation of, for example, hardware constituting a general computer and a program (software) executed on the computer. For example, by a computer executing a predetermined program, functional components included in the information retrieval apparatus 10 such as the acquisition unit 13, the first similar process identification unit 14, the first subsequent process identification unit 15, the second similar process identification unit 16, the second subsequent process identification unit 17, the retrieval unit 18, the display control unit 19, the before-and-after similar process identification unit 21, the third subsequent process identification unit 22, the third similar process identification unit 23, and the fourth subsequent process identification unit 24 can be implemented. Further, by using a storage device included in the computer, the existing plant database 11 and the case database 12 described above can be constructed.

Figure 16:
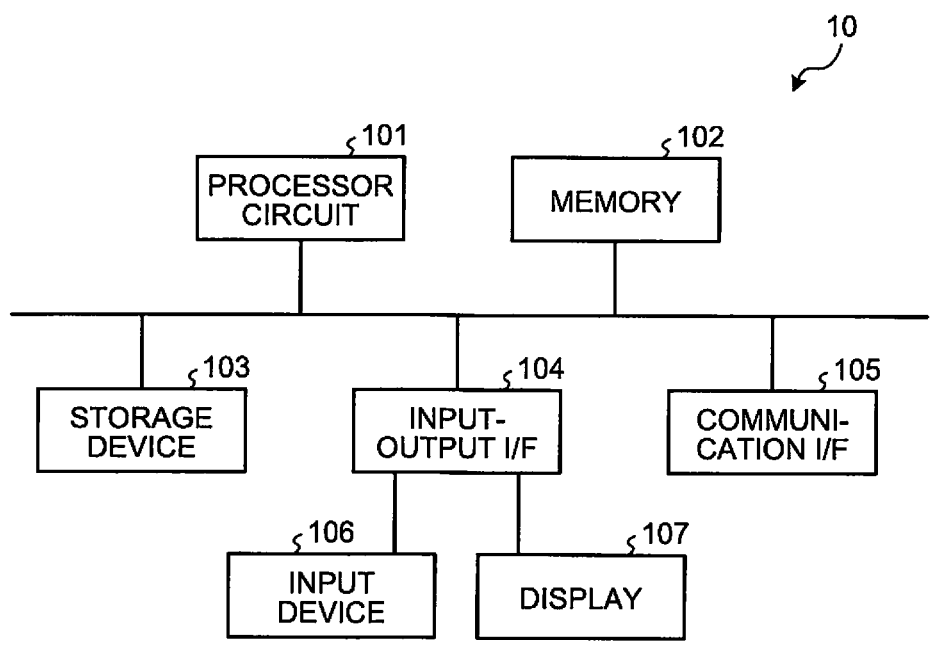
FIG. 16 is a block diagram illustrating a hardware configuration example of the information retrieval apparatus.

FIG. 16 is a block diagram illustrating a hardware configuration example of the information retrieval apparatus 10. As illustrated in FIG. 16, for example, the information retrieval apparatus 10 has a hardware configuration of a general computer including a processor circuit 101 such as a central processing unit (CPU) or a graphics processing unit (GPU), a memory 102 such as random access memory (RAM) or read-only memory (ROM), a storage device 103 such as a hard disk drive (HDD) or a solid-state drive (SDD), an input-output I/F 104 for connecting peripheral devices such as an input device 106 and a display 107, and a communication I/F 105 that communicates with an external device such as the client terminal 30 via the network 50. By the processor circuit 101 executing a program stored in the storage device 103, the memory 102, or the like while using the memory 102, for example, the above-described functional components can be implemented.

That is, the units illustrated as functional components of the information retrieval apparatus 10 in the first embodiment and the second embodiment described above are included in a program executed by a computer. By at least one processor included in the computer (the processor circuit 101 in FIG. 16) executing this program, the above-described units are generated in main memory such as RAM (the memory 102 in FIG. 16).

The program executed by the computer is provided by being recorded on a magnetic disk, an optical disk, a magneto-optical disk, semiconductor memory, or a recording medium similar to them, for example. If a recording medium recording a program is a computer-readable recording medium, its storage format may be any form. The program may be preinstalled in a computer, or the program distributed via a network may be appropriately installed in a computer.

The information retrieval apparatus 10 in the first embodiment and the second embodiment described above may have a configuration in which part or all of the above-described functional components are implemented by dedicated hardware such as an application-specific integrated circuit (ASIC) or a field-programmable gate array (FPGA).

The information retrieval apparatus 10 in the first embodiment and the second embodiment described above may be configured as a network system in which a plurality of computers is communicably connected, and may be configured to distribute the above-described functional components among the plurality of computers to implement them. The information retrieval apparatus 10 in the first embodiment and the second embodiment described above may be a virtual machine operating on a cloud system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information retrieval apparatus for retrieving cases that can be useful references in designing a new plant from a case database storing cases of troubles that have occurred in existing plants each constructed through a plurality of processes, the apparatus comprising:
processing circuitry configured to:
identify at least one first similar process similar to a process of interest corresponding to a certain design phase in design of a new plant, among processes of a plurality of existing plants, based on a design document of the process of interest and design documents of individual processes of each of the plurality of existing plants;
identify at least one first subsequent process, a process after the first similar process, based on a design flow indicating a sequence of a plurality of processes in an existing plant including the first similar process; and
retrieve a case corresponding to the first similar process and a case corresponding to the first subsequent process from the case database.

2. The apparatus according to claim 1, wherein the processing circuitry is configured to:
identify at least one second similar process similar to the first subsequent process among the processes of the plurality of existing plants, based on a design document of the first subsequent process and the design documents of the individual processes of each of the plurality of existing plants; identify at least one second subsequent process, a process after the second similar process, based on a design flow indicating a sequence of a plurality of processes in an existing plant including the second similar process; and
further retrieve a case corresponding to the second similar process and a case corresponding to the second subsequent process from the case database.

3. The apparatus according to claim 1, wherein the processing circuitry is configured to:
identify at least one before-and-after similar process whose immediately preceding process and immediately following process are similar to an immediately preceding process and an immediately following process of the process of interest, respectively, among the processes of the plurality of existing plants, based on a design document of the immediately preceding process of the process of interest, a design document of the immediately following process of the process of interest, the design documents of the individual processes of each of the plurality of existing plants, and a plurality of design flows each indicating a sequence of a plurality of processes in an existing plant for the plurality of individual existing plants;
identify at least one third subsequent process, a process after the before-and-after similar process, based on a design flow indicating a sequence of a plurality of processes in an existing plant including the before-and-after similar process; and
further retrieve a case corresponding to the before-and-after similar process and a case corresponding to the third subsequent process from the case database.

4. The apparatus according to claim 3, wherein the processing circuitry is configured to:
identify at least one third similar process similar to the before-and-after similar process among the processes of the plurality of existing plants, based on a design document of the before-and-after similar process and the design documents of the individual processes of each of the plurality of existing plants;
identify at least one fourth subsequent process, a process after the third similar process, based on a design flow indicating a sequence of a plurality of processes in an existing plant including the third similar process; and further retrieve a case corresponding to the third similar process and a case corresponding to the fourth subsequent process from the case database.

5. The apparatus according to claim 1, further comprising:

a display controller configured to cause a display device to display results of retrieval by the processing circuitry together with information indicating a relationship between each case contained in the retrieval results and the process of interest.

6. The apparatus according to claim 5, wherein:

the display controller prioritizes the cases contained in the retrieval results in order determined based on the relationships with the process of interest, and causes the display device to display the cases in the order.

7. An information retrieval method performed by an information retrieval apparatus for retrieving cases that can be useful references in designing a new plant from a case database storing cases of troubles that have occurred in existing plants each constructed through a plurality of processes, the method comprising:

identifying at least one first similar process similar to a process of interest corresponding to a certain design phase in design of a new plant, among processes of a plurality of existing plants, based on design documents of individual processes of each of the plurality of existing plants and a design document of the process of interest;

identifying at least one first subsequent process, a process after the first similar process, based on a design flow indicating a sequence of a plurality of processes in an existing plant including the first similar process; and retrieving a case corresponding to the first similar process and a case corresponding to the first subsequent process from the case database.

8. A non-transitory computer readable medium recording programmed instructions for retrieving cases that can be useful references in designing a new plant from a case database storing cases of troubles that have occurred in existing plants each constructed through a plurality of processes, the instructions, when executed by a computer, causing the computer to perform:

identifying at least one first similar process similar to a process of interest corresponding to a certain design phase in design of a new plant, among processes of a plurality of existing plants, based on design documents of individual processes of each of the plurality of existing plants and a design document of the process of interest;

identifying at least one first subsequent process, a process after the first similar process, based on a design flow indicating a sequence of a plurality of processes in an existing plant including the first similar process; and retrieving a case corresponding to the first similar process and a case corresponding to the first subsequent process from the case database.

\* \* \* \* \*